United States Patent [19]
Sakiyama et al.

[11] Patent Number: 5,550,544
[45] Date of Patent: Aug. 27, 1996

[54] SIGNAL CONVERTER, NOISE SHAPER, AD CONVERTER AND DA CONVERTER

[75] Inventors: Shiro Sakiyama; Shiro Dosho; Masakatsu Maruyama; Hiroyuki Nakahira, all of Osaka; Toshiyuki Shono; Akira Matsuzawa, both of Kyoto, all of Japan

[73] Assignee: Matsushita Electric Industrial Co., Ltd., Osaka, Japan

[21] Appl. No.: 200,493

[22] Filed: Feb. 23, 1994

[51] Int. Cl.$^6$ ........................................ H03M 1/00
[52] U.S. Cl. ................................. 341/155; 341/144
[58] Field of Search .................... 341/143, 200, 341/144, 145, 155

[56]            References Cited

U.S. PATENT DOCUMENTS 4,772,871  9/1988  Suzuki et al. ..................... 341/155
4,876,543  10/1989  van Bavel .......................... 341/143
5,068,661  11/1991  Kaneaki et al. .................... 341/143

*Primary Examiner*—Brian K. Young
*Attorney, Agent, or Firm*—McDermott, Will & Emery

[57]             ABSTRACT

The present invention provides a first-order delta-sigma AD converter adapted to conduct noise shaping and having a quantizer arranged such that, when the amplitude of an input signal entered into the quantizer is small, the amplitude of a difference signal between the input signal entered into the quantizer and an output signal therefrom, is small. It is therefore possible to achieve an efficient AD- or DA-converter reduced in power consumption, which satisfies the transmission characteristics of the specifications of CCITT G.714 based on a method of PCM-encoding an audio frequency band signal stipulated in the specifications of CCITT G.711.

13 Claims, 11 Drawing Sheets

INPUT/OUTPUT CHARACTERISTICS OF THE QUANTIZER

Fig.10

$\boxed{1.000010} \rightarrow \boxed{1.000} \times 10^0 V$ $\boxed{0.001000} \rightarrow \boxed{1.000} \times 10^{-3} V$ $\boxed{0.000001} \rightarrow \boxed{0.001} \times 10^{-3} V$

SIGNAL CONVERTER, NOISE SHAPER, AD CONVERTER AND DA CONVERTER

BACKGROUND OF THE INVENTION

The present invention relates to improvements in a noise shaper, an AD converter and a DA converter of the oversampling type using a method of PCM-encoding an audio frequency band signal as stipulated in the specifications of CCITT G.711.

When there is used a method of PCM-encoding an audio frequency band signal as stipulated in the specifications of CCITT G.711, the specifications of CCITT G.714 set forth a stipulation of the transmit-receive separation characteristics of a four-line interface PCM encoding method. In the method of PCM-encoding an audio frequency band signal stipulated in the specifications of CCITT G.711, there are stipulated a compression method, called an A-rule, using approximation with 13 line segments, and a compression method, called a μ-rule, using approximation with 15 line segments. For 8-bit PCM data, either compression method requires precision of about 12 bits at the smaller-amplitude side and precision of about 7 bits at the larger-amplitude side.

For realizing an AD converter or a DA converter based on the encoding method above-mentioned, such an AD or DA converter is required to present precision of about 12 bits.

As examples of the AD converter presenting precision of about 12 bits, there have been conventionally developed a variety of AD converters of the sequential comparison type in each of which one analog signal is sequentially compared with each of a plurality of reference levels to obtain a digital signal. This is because the sequential comparison type can be adopted because of the fact that the audio frequency band is relatively narrow, and because such an AD converter is balanced most in view of power consumption and circuit size.

In the AD converter of the sequential comparison type above-mentioned, however, it is required to dispose a sharp pre-filter for limiting the input band. In this connection, such an AD converter is formed with the use of SCF (switched capacitor) technique in order to make the component elements including such a pre-filter in the form of an IC.

With the recent demand for miniaturization in the semiconductor processing technique, there has been developed, as analog data/digital data mutual converting means, an AD converter or DA converter of the oversampling type using a delta-sigma modulating method. In such an oversampling AD converter or DA converter of the delta-sigma modulating type, as shown in FIG. 13, while sampling a signal with frequency Fs which is tens to hundreds times of the upper-limit frequency FBW of the signal band, frequency characteristics are given quantization noise such that the quantization noise presents a peak at frequency of ½ of the sampling frequency Fs (Nyquist frequency), that the quantization noise is reduced to a small value in the signal band and that a high-band component of the quantization noise is removed by a digital lowpass filter at a subsequent stage. This method is also called noise shaping.

The oversampling AD converter or DA converter of the delta-sigma modulating type above-mentioned, can effect a highly precise conversion without use of a multiple-bit highly precise DA converting unit used in an AD converter of the sequential conversion type mentioned earlier. Further, the sampling frequency is high with respect to the signal band, so that the specifications required for a pre-filter are advantageously not so severe. With the recent demand for miniaturization in the semiconductor processing technique, there is a tendency to make a digital unit in a compact design with the power consumption lowered. Further, such an AD converting method of the oversampling type has good compatibility with other signal processing LSIs. In this connection, increasing attention will be given to such an AD converting method.

There are instances where, when arranging an AD converter or DA converter adopting the encoding method mentioned earlier, there is formed a converter presenting precision of about 12 bits, by an oversampling AD converter or DA converter of the delta-sigma modulating type. In such a case, it is required to form a second-order delta-sigma modulator in which the oversampling rate is about 100 times.

FIG. 11 shows the arrangement of a noise shaper using a second-order delta-sigma modulator. In FIG. 11, there are shown adders 51, 52, delay devices 53, 54, 55, a quantizer 56 for quantizing an input signal to a +1 or −1 2-level digital signal, and two signal accumulating means 57. 58 formed by the adders 51, 52 and the delay devices 54, 55. A digital output signal Y or 2-level signal is feedbacked to the adders 51, 52 of the signal accumulating means 57, 58 through the delay device 53. The output amplitude (+1, −1) feedbacked through the delay device 53, is set to the maximum amplitude of an input signal X. An output of the signal accumulating means 57 at the former stage is entered into the signal accumulating means 58 at the latter stage, and an output signal of the latter-stage signal accumulating means 58 is entered into the quantizer 56.

The following equation shows system functions of the second-order delta-sigma modulator shown in FIG. 11:

$$Y(z)=X(z)+(1-z^{-1})^2 \cdot Q(z) \tag{1}$$

wherein X is the input, Y is the output and Q is quantization noise.

In the equation (1), Q is quantization noise. This quantization noise Q has been subjected to second-order noise shaping. Accordingly, when the sampling frequency is sufficiently high as compared with the band of the input signal X, the input signal X and the quantization noise Q can be separated from each other by filtering the digital output signal Y.

in the oversampling AD converter or DA converter of the delta-sigma type above-mentioned, the following three methods can be proposed in order to realize, by reducing quantization noise in the signal band, an oversampling AD converter or DA converter of the delta-sigma type which satisfies the transmission characteristics based on the encoding method above-mentioned.

1) To use a higher order delta-sigma modulator

2) To increase the sampling rate

3) To increase the number of the quantizing levels

However, any of the methods 1) to 3) presents the following defects.

More specifically, the transmission characteristics based on the encoding method above-mentioned may present such precision that the signal/noise ratio is about 7 bits when the amplitude of the input signal is great, but are required to present such precision that the signal/noise ratio is about 12 bits when the amplitude of the input signal is small. When, according to any of the quantization noise reducing methods 1) to 3) above-mentioned, there is achieved an arrangement which assures precision of about 12 bits when the amplitude of the input signal is small, there is also assured precision of about 12 bits even when the amplitude of the input signal is great. Accordingly, the specifications of CCITT G.711 are excessively satisfied. This disadvantageously lowers the efficiency.

Further, when a high order delta-sigma modulator is used as mentioned in the above item 1), the quantization noise in the signal band can be sent away toward the higher frequency side, so that the quantization noise in the signal band can be efficiently reduced. However, this disadvantageously requires to increase, with an increase in order, the number of signal accumulating circuits for accumulating each difference signal.

Further, it is theoretically possible to reduce the quantization noise in the signal band by increasing the sampling rate as mentioned in the above item 2). However, such an increase in sampling rate is limited to a certain degree in view of the processing speeds of analog or digital elements and the power consumption.

When there are formed a plurality of quantization levels, instead of one bit, as mentioned in the above item 3), the quantization noise itself can be reduced. However, this disadvantageously requires a great number of comparators for forming the quantizer.

APPLICATION OF THE DISCLOSURE

It is a first object of the present invention to provide an oversampling AD converter or DA converter of the delta-sigma type which necessarily fully satisfies the transmission characteristics based on the specifications of CCITT G.711 mentioned earlier.

It is a second object of the present invention to apply the arrangement which is the characteristic of the present invention, not only to the oversampling AD converter or DA converter of the delta-sigma type above-mentioned (hereinafter referred to as the signal converter) or a noise shaper, but also to any of signal converters of other type than the delta-sigma type or a noise shaper.

To achieve the objects above-mentioned, the present invention Is arranged such that a quantizer is made in the form of a non-linear quantizer in which there are present, according to the amplitude of an input signal, a plurality of average amplitudes for a difference signal (quantization noise) which represents a difference between an input signal and an output signal of the quantizer. More specifically, a plurality of reference levels previously set in the quantizer are not set at regular intervals, but set at irregular intervals. Accordingly, provision is made such that the signal precision is about 12 bits when the amplitude of an input signal is small, and the signal precision is about 7 bit when the amplitude is great, while minimizing the number of comparators forming the quantizer.

More specifically, a signal converter according to the present invention comprises a quantizer in which an input signal is compared with each of preset (n–1) reference levels and quantized into one of n-digital output signals, and is arranged such that the (n–1) reference levels of the quantizer are set such that there are present, according to the amplitude of the input signal, a plurality of average amplitudes for a difference signal representing a difference between the input signal and an output signal of the quantizer.

A noise shaper of the oversampling type according to the present invention comprises: a quantizer in which an input signal is compared with each of preset (n–1) reference levels and quantized into one of n-digital output signals; a delay device for delaying a digital output signal of the quantizer by a preset period of time; and signal accumulating means for accumulating a difference signal between an external input signal and an output signal of the delay device, an output signal of the signal accumulating means being entered into the quantizer, and the noise shaper is characterized in that the (n–1) reference levels of the quantizer are set such that there are present, according to the amplitude of the input signal, a plurality of average amplitudes for a difference signal representing a difference between the input signal and the output signal of the quantizer.

Further, the present invention forms a noise shaping AD converter and a noise shaping DA converter each using the noise shaper above-mentioned.

According to the present invention, the (n–1) reference levels of the quantizer may be set in a manner such that the average amplitude of a difference signal representing a difference between an input signal and an output signal of the quantizer, is small when the amplitude of the input signal is small.

According to the present invention, the (n–1) reference levels of the quantizer may be set in another manner such that the average amplitude of a difference signal representing a difference between an input signal and an output signal of the quantizer, is great when the amplitude of the input signal is small.

According to the present invention having the arrangement above-mentioned, the quantizer is arranged such that a difference signal between an input signal and an output signal, i.e., the absolute quantity of quantization noise, is great when the amplitude of an external input signal is great, and the difference signal above-mentioned is small when the amplitude of the external input signal is small. Accordingly, the present invention can provide a noise shaper, a noise shaping AD converter and a noise shaping DA converter each of which is improved in S/N ratio (signal/total noise ratio) as the amplitude of an external input signal is smaller. It is therefore possible to provide the most suitable characteristics for a method of PCM-encoding an audio frequency band signal stipulated in the specifications of CCITT G.711. Further, even though such specifications are changed in a severe manner, the present invention could satisfy and conform with such severe specifications.

These and other features, objects and advantages of the present invention will be more fully apparent from the following detailed description set forth below when taken in conjunction with the accompanying drawings.

BRIEF DESCRIPTION OF THE DRAWINGS

Attached drawings show preferred embodiments of the present invention, wherein:

FIG. 7 (b) is a view illustrating the input/output characteristics of the quantizer in the noise shaper in FIG. 7 (a);

FIG. 10 illustrates a method of displaying numerical values in an instrument;

DESCRIPTION OF THE INVENTION

The following description will discuss preferred embodiments of the present invention with reference to attached drawings.

Figure 1:
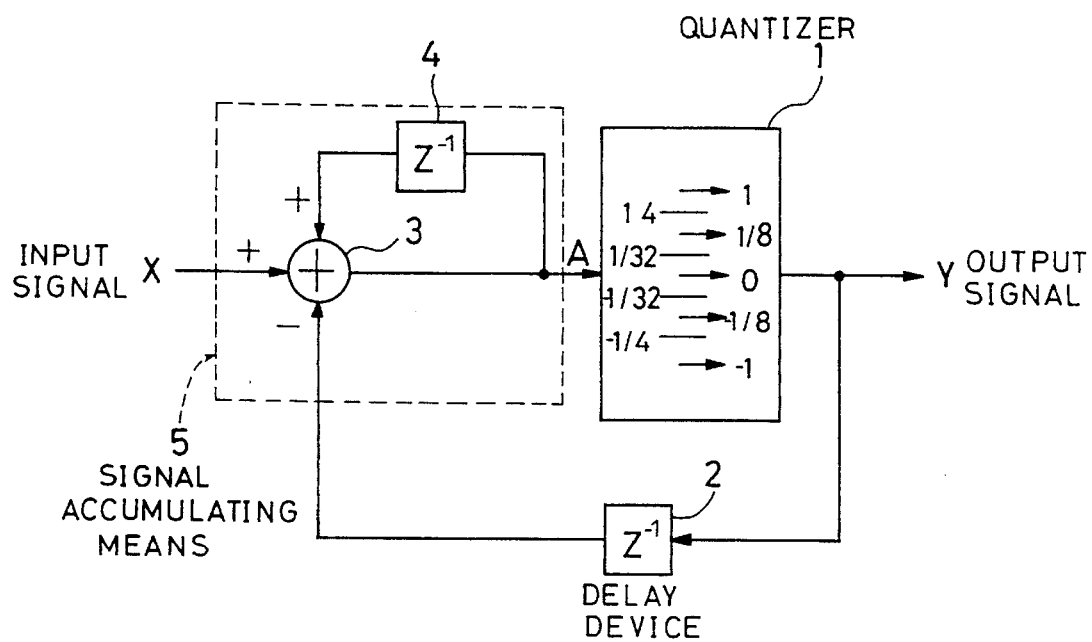
FIG. 1 is a view illustrating a first-order noise shaper according to an embodiment of the present invention.

FIG. 1 shows a signal diagram of a noise shaper as a first embodiment of the present invention.

In FIG. 1, a quantizer 1 previously containing four reference levels is arranged such that an input signal A entered into the quantizer 1 is compared with each of the reference levels, causing the input signal A to be quantized to one of 5-level digital values.

There is also disposed a delay device 2 for delaying a digital output signal Y from the quantizer 1 by a predetermined period of time.

There are also disposed an adder 3, and a delay device 4 for delaying an output signal of the adder 3 by a predetermined period of time. The adder 3 is arranged to calculate and supply a difference between an external input signal X and an output signal of the delay device 2, and the difference signal thus supplied is to be entered, through the delay device 4, into the adder 3 next time. Accordingly, the adder 3 and the delay device 4 form signal accumulating means 5 for accumulatingly adding each difference between each input signal X and each output signal of the delay device 2. An output of the signal accumulating means 5, i.e., an output of the adder 3 serves as the input signal A of the quantizer 1.

The four reference levels in the quantizer 1 are set such that when the amplitude of the input signal A of the quantizer 1 is small, a difference signal (i.e., quantization noise Q) representing a difference between the input signal A and the output signal Y is smaller in amplitude than when the amplitude of the input signal A of the quantizer 1 is great. In other words, the reference levels are set such that, the intervals among the reference levels are narrower as the amplitude of the input signal A is closer to zero, and the intervals among the reference levels are wider as the absolute value of the amplitude of the input signal A is greater. More specifically, the four reference levels of the quantizer 1 are set in the following manner. The reference levels are set as $-\frac{1}{4}$, $-\frac{1}{32}$, $+\frac{1}{32}$ and $+\frac{1}{4}$ with respect to the maximum amplitude of the external input signal X. Provision is made such that the quantizer 1 supplies, as the output signal Y, 1 when the amplitude of the input signal A to the quantizer 1 is not less than $\frac{1}{4}$ of the maximum amplitude of the input signal X, $\frac{1}{8}$ when such an amplitude is less than $\frac{1}{4}$ and not less than $\frac{1}{32}$ of the maximum amplitude of the input signal X, 0 when such an amplitude is less than $\frac{1}{32}$ and not less than $-\frac{1}{32}$ of the maximum amplitude of the input signal X, $-\frac{1}{8}$ when such an amplitude is less than $-\frac{1}{32}$ and not less than $-\frac{1}{4}$ of the maximum amplitude of the input signal X, and $-1$ when such an amplitude is less than $-\frac{1}{4}$.

A signal to be added to the input signal X in the adder 3 in FIG. 1, is shown in the following equation:

$$AZ^{-1} - YZ^{-1}$$

This equation can be modified in the following equation:

$$(A-Y)Z^{-1}$$

Figure 2:
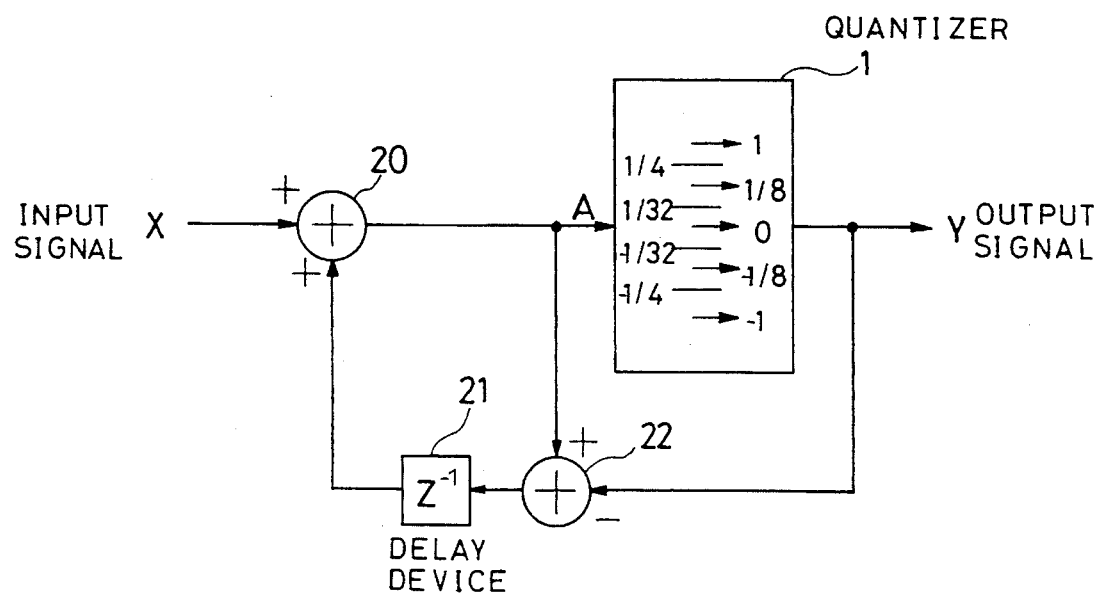
FIG. 2 is a view of an equivalent circuit of the first-order noise shaper in FIG. 1.

FIG. 2 shows a signal diagram which is formed according to the equation above-mentioned. System functions of the signal diagram in FIG. 2 are the same as those of the signal diagram shown in FIG. 1. More specifically, FIG. 2 shows a quantizer 1, a first adder 20, a delay device 21 and a second adder 22, and an external input signal X and an output signal of the delay device 21 are added to each other in the first adder 20, thereby to supply a signal A. The output signal A of the first adder 20 is quantized in the quantizer 1, thereby to supply a signal Y.

The following description will discuss the operation of the noise shaper above-mentioned.

Quantization noise Q generated by the quantizer 1 is expressed by the following equation:

$$Q = A - Y$$

That is, an output of the second adder 22 in FIG. 2 is the quantization noise Q.

The quantization noise Q varies with the amplitude of the input signal X. More specifically, when the amplitude of the input signal X is not less than |⅛| of the maximum amplitude, the amplitude Q of the quantization noise is expressed by the following equation:

$$|Q| \leq (1 - \tfrac{1}{4}) = \tfrac{3}{4}$$

When the amplitude is not greater than |⅛| of the maximum amplitude, the amplitude Q of the quantization noise is expressed by the following equation:

$$|Q| \leq (\tfrac{1}{8} - \tfrac{1}{32}) = \tfrac{3}{32}$$

Accordingly, it is understood that the level of the quantization noise Q generated by the quantizer 1 in the present invention, is changed into one of a plurality of levels dependent on the amplitude of the input signal X.

The following equations show system functions at the time when the arrangement shown in FIG. 1 or FIG. 2 is used. In each of the following equations, the quantization noise Q is subjected to first-order noise shaping.

$$Y(z) = X(z) + (1 - z^{-1}) \cdot Q(z) \cdot \tfrac{3}{4} \qquad (2a)$$

(where the amplitude of the input signal X is not less than |⅛| of the maximum amplitude)

$$Y(z) = X(z) + (1 - z^{-1}) \cdot Q(z) \cdot \tfrac{3}{32} \qquad (2b)$$

(where the amplitude of the input signal X is less than |⅛| of the maximum amplitude)

In each of the equations 2a and 2b, X is the input, Y is the output and Q is the quantization noise. Further, as the amplitude of the input signal X is smaller and closer to zero, there is increased probability of existence of the quantization noise of $\frac{1}{32} \cdot Q$, compared with that of the quantization noise of $\frac{3}{32} \cdot Q$. More specifically, as the amplitude of the input signal X is smaller, there is increased the probability that the quantization noise of $\frac{1}{32} \cdot Q$ is present more than the quantization noise of $\frac{3}{32} \cdot Q$, and the amplitude of the quantization noise Q gets close to noise electric power of $\frac{1}{32} \cdot Q$.

Figure 5:
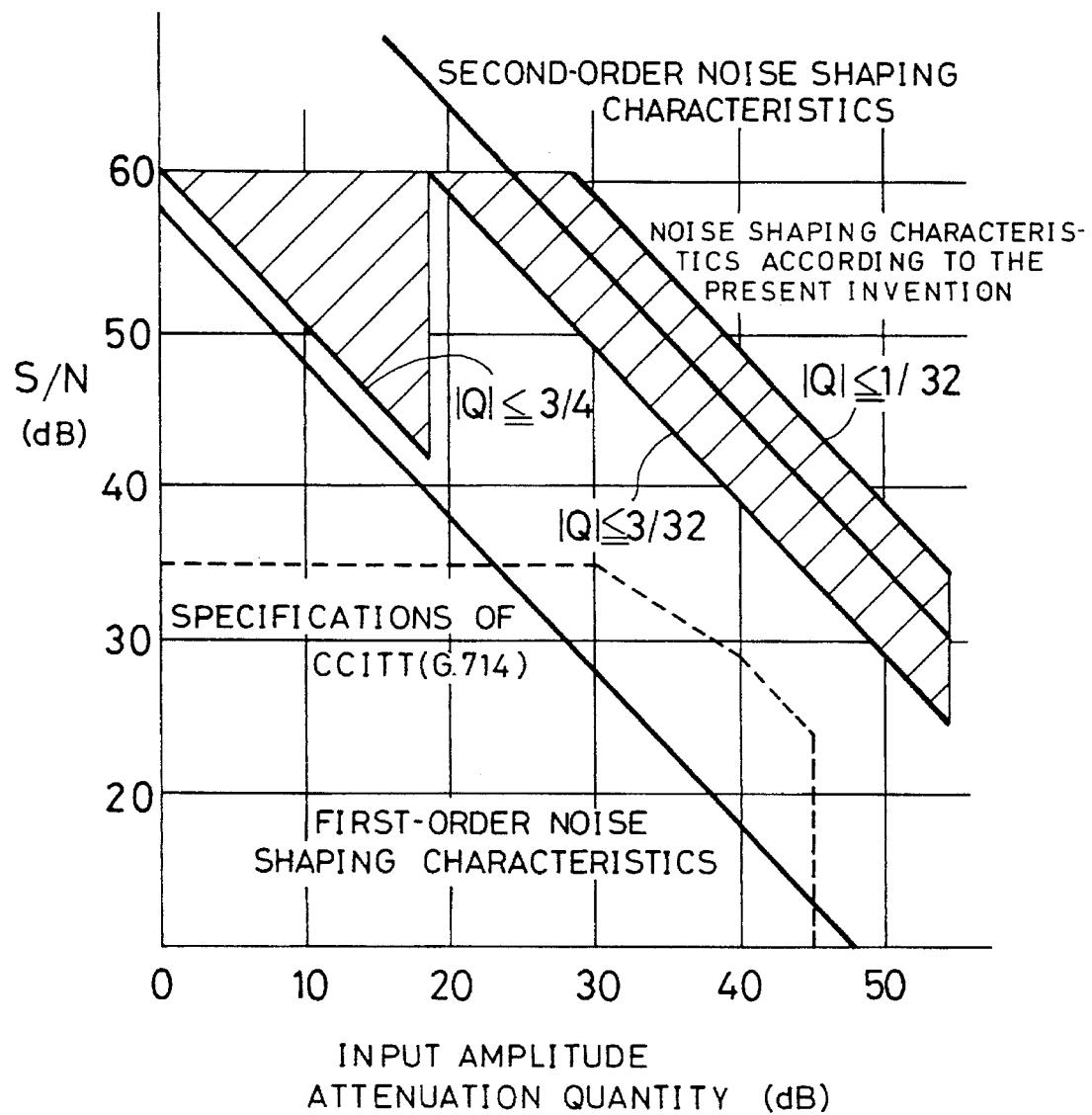
FIG. 5 is a view illustrating the signal/total noise ratio characteristics dependent on the input amplitude in the first-order noise shaper in FIG. 1.

FIG. 5 shows the characteristics of S/N ratio (ratio of an input signal component S to an in-band quantization noise component N) when the amplitude of the input signal X is changed with the use of the noise shaper shown in FIG. 1. It is noted that FIG. 5 shows the S/N ratio characteristics obtained by conducting quantization with 96-times oversampling with the use of the noise shaper shown in FIG. 1, and such S/N ratios were obtained in the band of 4 KHz at the time when an input signal of 1 KHz was applied.

Figure 11:
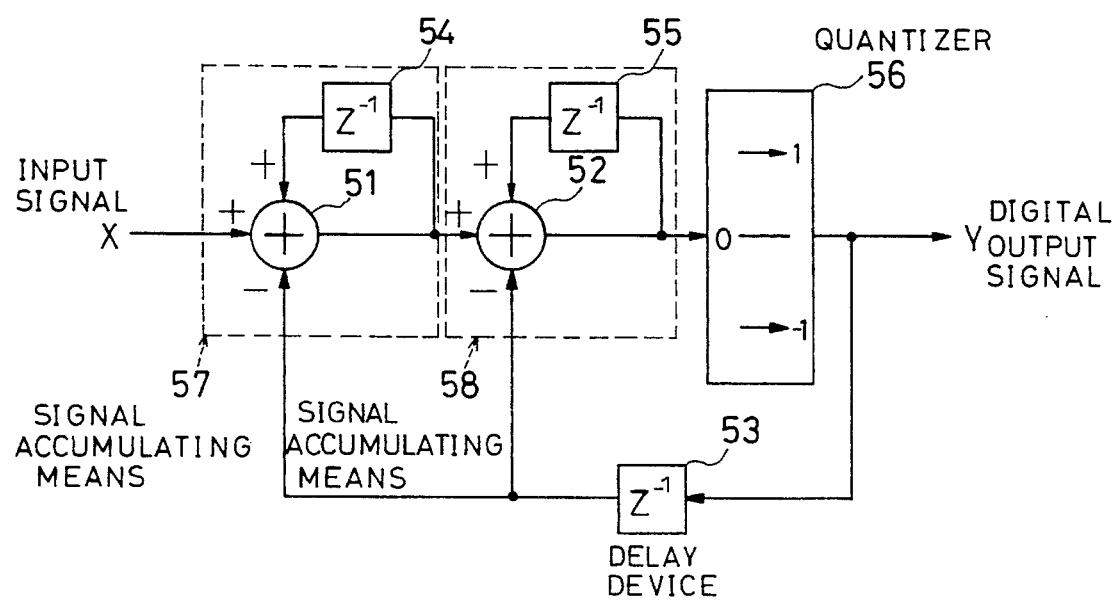
FIG. 11 is a view of the arrangement of a conventional second-order noise shaper.

As apparent from FIG. 5, when each signal is subjected to 96-times oversampling, the conventional first-order noise shaping characteristics obtained by using a 2-level quantizer, cannot satisfy the specifications of CCITT, and the specifications of CCITT can be satisfied only by the conventional second-order noise shaping characteristics shown in FIG. 11.

On the other hand, the noise shaping characteristics obtained with the use of the noise shaper shown in FIG. 1 are as follows. When the amplitude of the input signal X is not less than |⅛| of the maximum amplitude, there are mixingly present three types of S/N characteristics, i.e., (i) the S/N characteristics obtained at the time when the amplitude of the quantization noise Q is not greater than ¾, (ii) the S/N characteristics obtained at the time when the amplitude of the quantization noise Q is not greater than $\frac{3}{32}$, and (iii) the S/N characteristics obtained at the time when the amplitude of the quantization noise Q is not greater than $\frac{1}{32}$. When the amplitude of the input signal X is smaller than |⅛| of the maximum amplitude, there are mixingly present two types of S/N characteristics, i.e., (i) the S/N characteristics obtained at the time when Q is not greater than $\frac{3}{32}$ and (ii) the S/N characteristics obtained at the time when Q is not greater than $\frac{1}{32}$. Accordingly, the S/N characteristics are distributed in hatched areas in FIG. 5. These characteristics sufficiently satisfy the specifications of CCITT.

In the following, the noise shaper according to an embodiment of the present invention in FIG. 1 is compared with the conventional second-order noise shaper shown in FIG. 11.

In the noise shaper of the present invention, as the amplitude of the input signal X is smaller, the quantization noise is reduced and the quantization noise in the input signal band is proportionally reduced, thus improving the S/N ratio, as understood from the equations (2a), (2b).

As apparent from FIG. 5, in the noise shaper of the present invention, the S/N ratio satisfies the specifications of CCITT G.714 in the area where the amplitude of the input signal X is not less than ⅛ (in the area where the attenuation quantity is not greater than 18 dB), and there is assured precision of about 7 bit according to a method of PCM-encoding an audio frequency band signal. However, the S/N ratio in the noise shaper of the present invention is lower than the S/N ratio in the conventional second-order noise shaper of the delta-sigma type. However, when an output signal of the conventional second-order noise shaper is subjected to data compression according to the PCM encoding method stipulated in the G711, the S/N ratio does not theoretically exceed 40 dB for the amplitude of an input signal of not less than −30 dB. Accordingly, it is practically meaningless to assure an S/N ratio of not less than 40 dB for an amplitude of not less than −30 dB with respect to the maximum amplitude.

Accordingly, the characteristics of the noise shaper of the present invention are substantially equal to the conventional noise shaping characteristics of the second-order delta-sigma type for the amplitude of an input signal of not greater than −30 dB.

Figure 12:
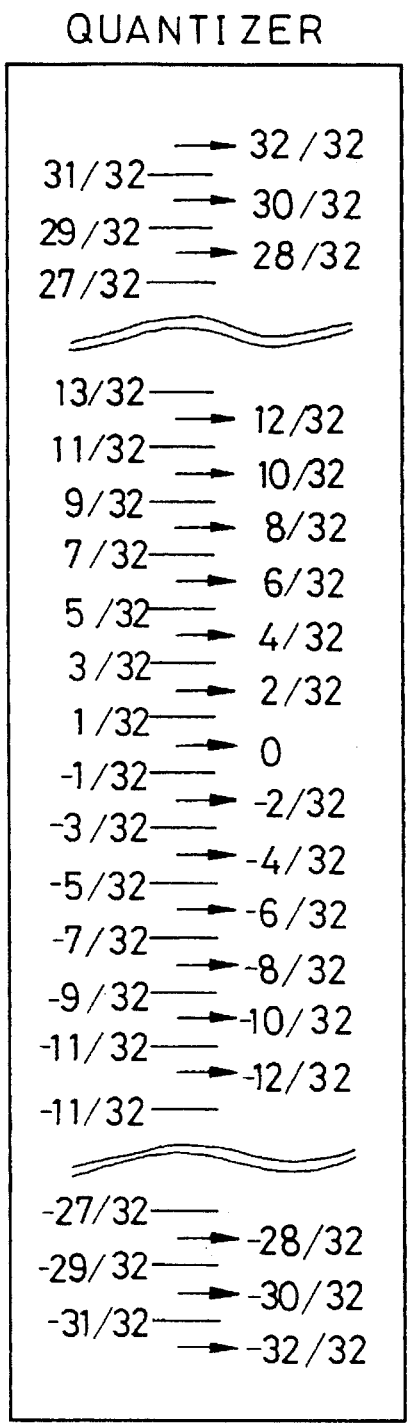
FIG. 12 is a view of the arrangement of a quantizer in a conventional multiple-level noise shaper.
Figure 13:
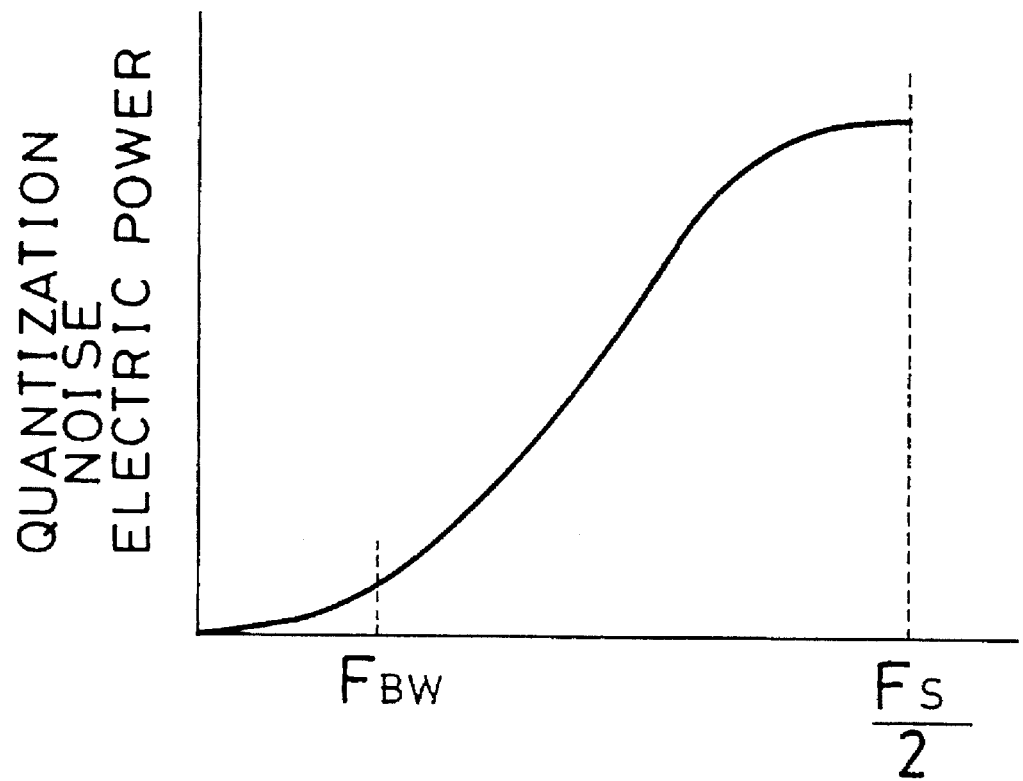
FIG. 13 illustrates the frequency characteristics of quantization noise by noise shaping.

Further, for the quantizer 1 in this embodiment, four comparators are sufficient. On the other hand, when the quantizer in the first-order noise shaper shown in FIG. 12 is formed by a multiple-level quantizer and it is desired to achieve S/N characteristics equivalent to a line of $|Q| \leq \frac{1}{32}$ shown in FIG. 5, it is required to set the reference levels such that, as shown in FIG. 12, the electric power levels of the quantization noise are linear every $\frac{1}{32}$ with respect to the amplitude of an input signal, i.e., the electric power levels of quantization noise are constant regardless of the amplitude of the input signal. In this connection, there is required a quantizer in which 32 comparisons are required. This causes the circuit to be increased in size. On the other hand, the noise shaper of this embodiment can achieve S/N characteristics which satisfy the specifications of CCITT, even the number of the comparators is reduced to ⅛ as compared with the number of the comparators required in the conventional noise shaper.

Figure 3:
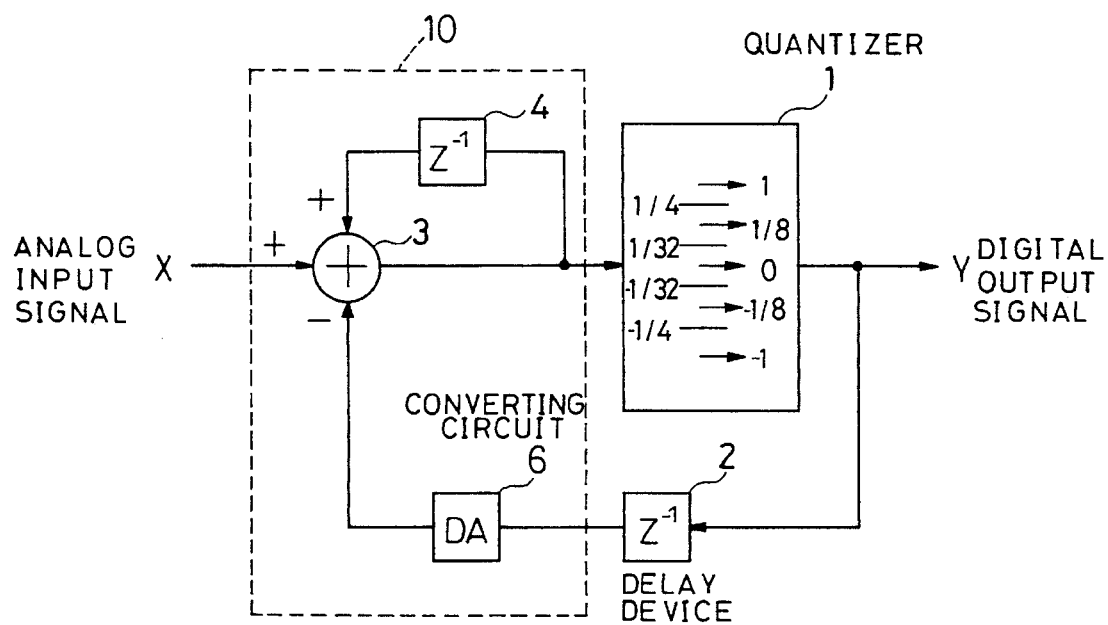
FIG. 3 is a view of an AD converter of the noise shaping type according to the present invention.

FIG. 3 shows an embodiment of an AD converter formed with the use of the noise shaper shown in FIG. 1.

The AD converter in FIG. 3 has, in addition to the quantizer 1, the delay device 2, the adder 3 and the delay device 4 which form the noise shaper shown in FIG. 1, a DA converting circuit 6 for converting a 5-level digital value into a 5-level analog signal.

The adder 3, the delay device 4 and the DA converting circuit 6 form a summing integrator 10, which is formed with the use of active elements such as an operational amplifier and the like.

An external analog signal X is entered into the adder 3, and the DA converting circuit 6 converts a digital signal from the delay device 2 into an analog signal, which is then supplied to the adder 3.

In the following, the noise shaping AD converter of the embodiment in FIG. 3 is compared, in view of power consumption, with an AD converter obtained by applying the conventional second-order noise shaper of the delta-sigma type shown In FIG. 11.

When a summing integrator is formed with the use of active elements such as operational amplifier and the like, such a summing integrator requires a relatively great electric power because of requirements as to slew rate, settling time, voltage gain and the like. In the AD converter using the conventional noise shaper in FIG. 11, two summing integrators are required, but only one summing integrator is sufficient in the embodiment shown in FIG. 3. Further, in the conventional example in FIG. 11, there is required, as the amplitude of an input signal to be entered into the second-stage summing integrator, amplitude which is two times greater than the amplitude of the input signal X. In this connection, it is required to set the dynamic range of the second-stage summing integrator to a great value. In the embodiment in FIG. 3, however, the specifications required for the summing integrator 10 can be relatively loose. The quantizer 1 requires four comparators. However, each of the comparators is used in an open loop and therefore requires no compensating capacitor for preventing oscillation. This enables the power consumption to be lowered. Accordingly, the noise shaping AD converter shown in FIG. 3 is generally simple in arrangement and reduced in power consumption as compared with the conventional AD converter.

Figure 4:
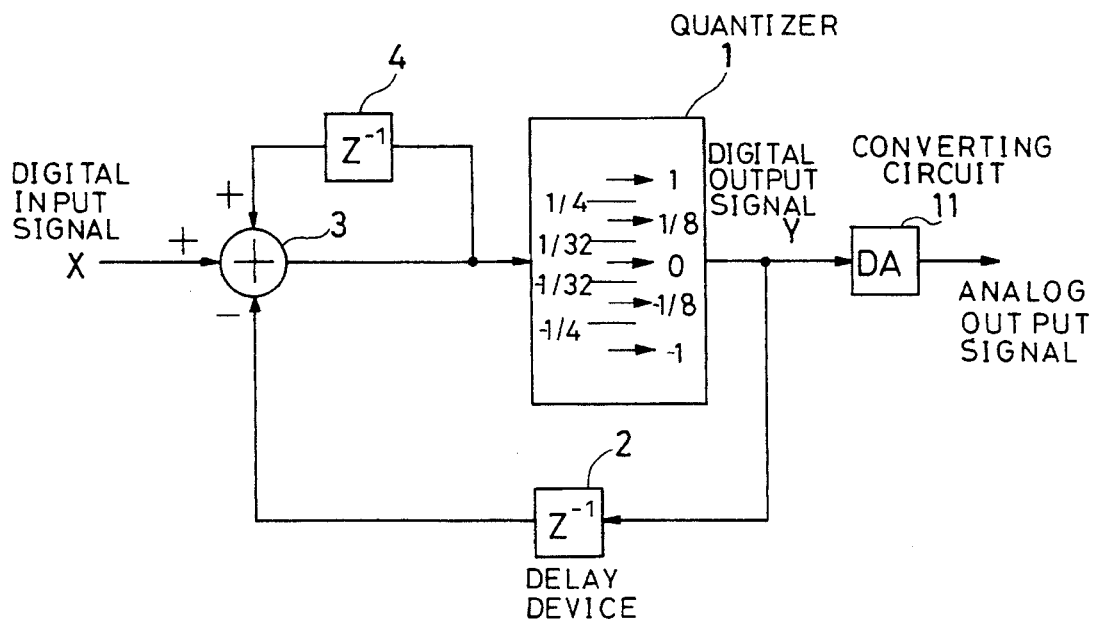
FIG. 4 is a view of a DA converter of the noise shaping type according to the present invention.

FIG. 4 shows an embodiment of a DA converter as arranged using the noise shaper shown in FIG. 1.

The DA converter in FIG. 4 comprises, in addition to the quantizer 1, the delay device 2, the adder 3 and the delay device 4 which form the noise shaper in FIG. 1, a DA converting circuit 11 for converting a 5-level digital value supplied from the quantizer 1 into a 5-level analog signal. An external digital signal X is supplied to the adder 3.

In the noise shaping DA converter of this embodiment, the comparators can be arranged merely as logical gates among bits, so that the number of elements can be reduced. Accordingly, likewise the noise shaping AD converter in FIG. 3, the DA converter in FIG. 4 is simple in arrangement and reduced in power consumption as compared with the conventional AD and DA converters.

Figure 6:
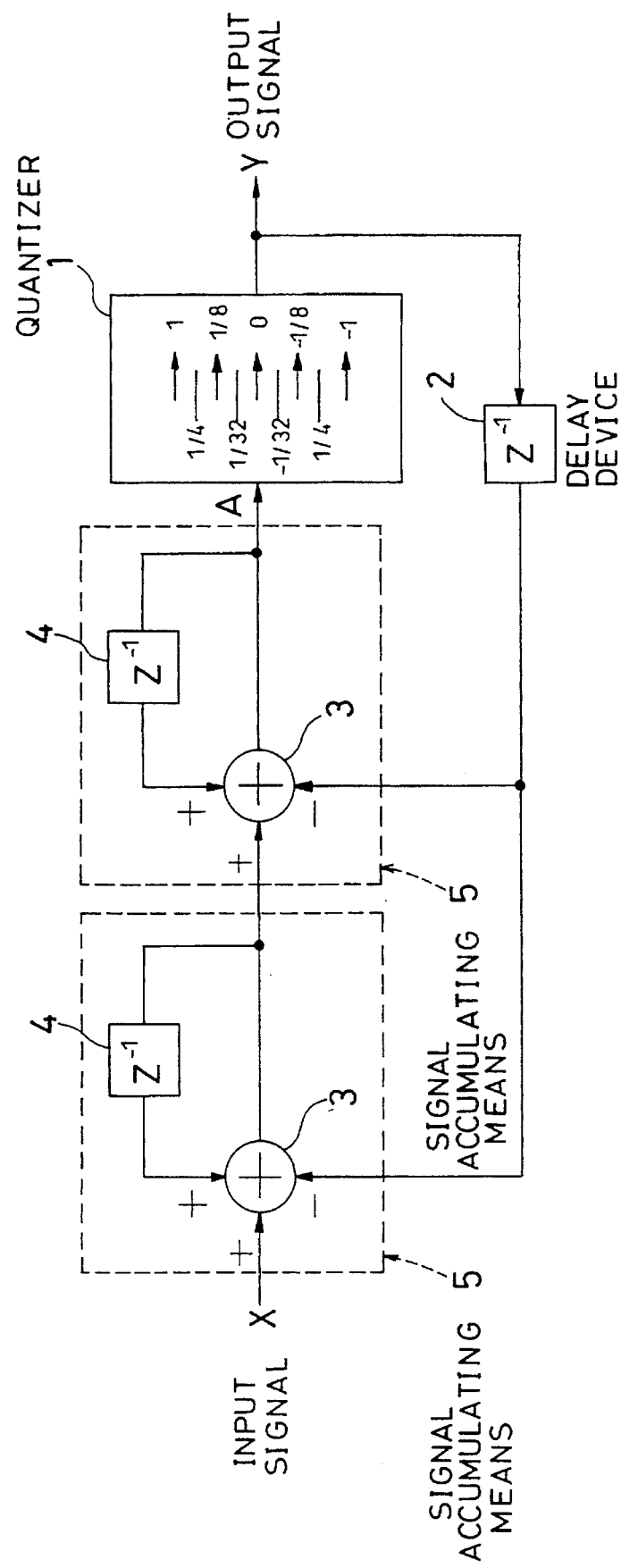
FIG. 6 is a view of a second-order noise shaper according to another embodiment of the present invention.

The description above-mentioned has discussed embodiments of the first-order delta-sigma noise shaper having a single signal accumulating means, but the present invention can also be applied to a second or more order delta-sigma noise shaper (having two or more signal accumulating means). FIG. 6 shows a second-order delta sigma noise shaper, which comprises, in addition to the arrangement of the first-order delta-sigma noise shaper shown in FIG. 1, second signal accumulating means 5 having the same arrangement of the signal accumulating means 5 shown in FIG. 1, this second signal accumulating means 5 being disposed between the signal accumulating means 5 and the quantizer 1. Except for the provision of this second signal accumulating means 5, the noise shaper in FIG. 6 has the same arrangement as that shown in FIG. 1. Accordingly, the description of the noise shaper in FIG. 6 is here omitted.

In the description above-mentioned, there has been discussed the oversampling noise shaper of the delta-sigma type in which the coefficient of the quantization noise Q is equal to $(1-Z^{-1})^n$ (where n is the order number). However, it is a matter of course that the present invention can also be applied to an oversampling noise shaper of other type.

Figure 7A:
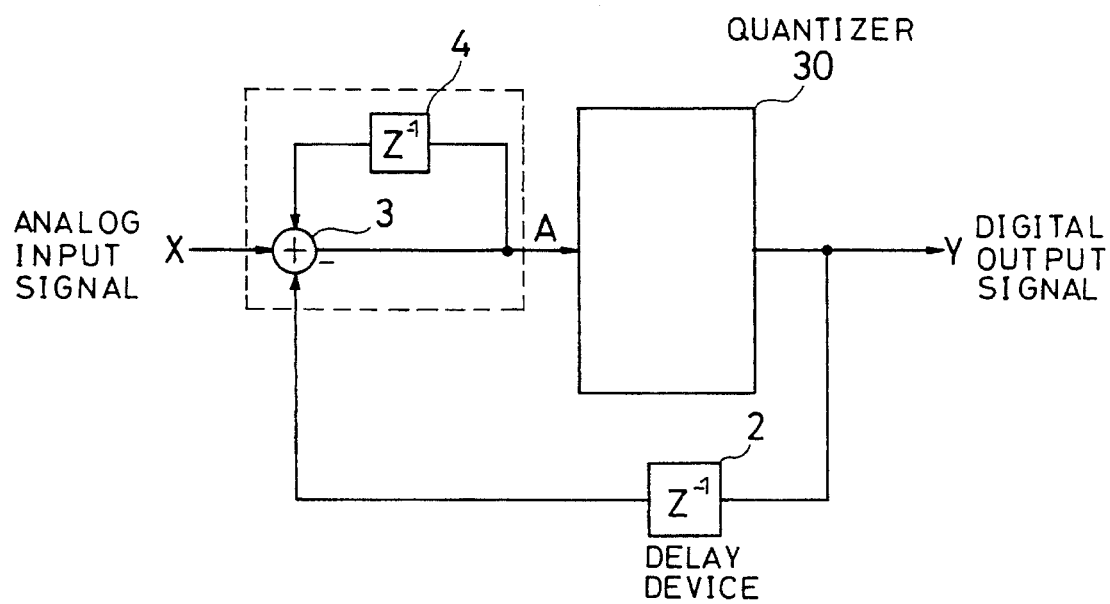
FIG. 7 (a) is a view of a first-order noise shaper according to a further embodiment of the present invention.
Figure 7B:
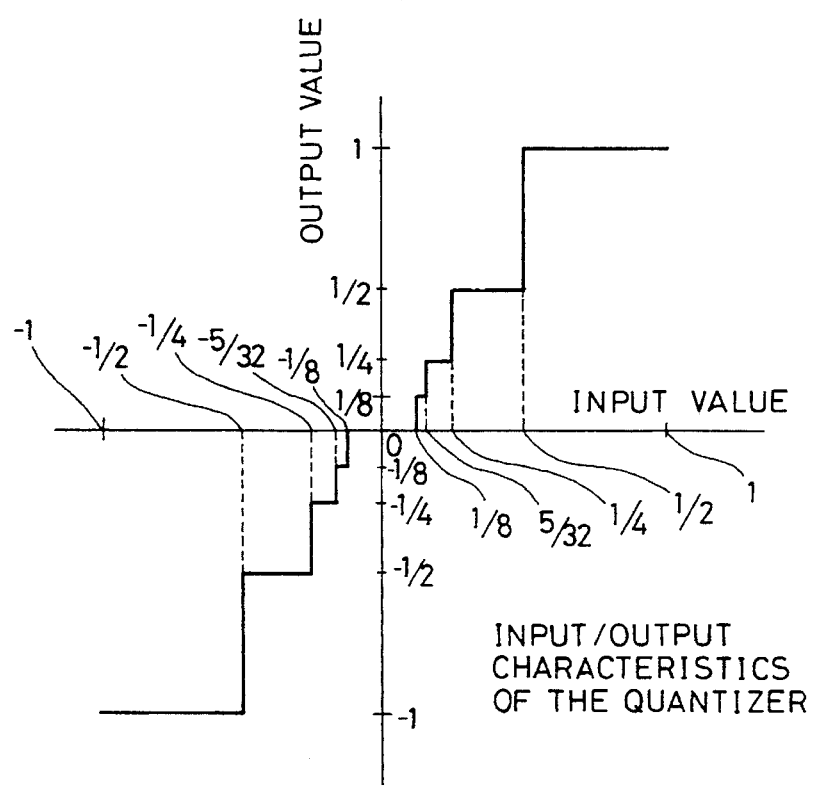

FIG. 7 (a) shows a signal diagram of a noise shaper according to another embodiment of the present invention. In FIG. 7 (a), the noise shaper has the same component elements as those in the noise shaper in FIG. 1, and there are disposed a quantizer 30, a delay device 2, an adder 3, a delay device 4 and signal accumulating means 5. A difference between each analog input signal X entered into the adder and each output signal of the delay device 2 is accumulated and added by the signal accumulating means 5, which then supplies a signal A representing the result of such accumulating addition.

In the quantizer 30 in FIG. 7, an input signal A entered into the quantizer 30 is compared with each of previously determined eight reference levels, and quantized into a 9-level digital value Y. Likewise in the quantizer 1 in FIG. 1 where the reference levels are set, the eight reference levels are previously determined in the quantizer 30 such that there are present, according to the amplitude of the analog input signal X, a plurality of levels for a difference signal (i.e., quantization noise Q) which represents a difference between the input signal A and the output signal Y of the quantizer 30. However, the specific setting method for the quantizer 1 is different from that for the quantizer 30.

More specifically, the reference levels in the quantizer 30 are set such that, when the amplitude of the input signal A is small, a change in the amplitude of a difference signal (i.e., quantization noise Q) representing a difference between the input signal A and the output signal Y of the quantizer 30, is greater than that when the amplitude of the input signal A is great. More specifically, as shown in FIG. 7 (b), the reference levels are set as $+\frac{1}{2}$, $+\frac{1}{4}$, $+\frac{5}{32}$, $+\frac{1}{8}$, $-\frac{1}{2}$, $-\frac{1}{4}$, $-\frac{5}{32}$ and $-\frac{1}{8}$ with respect to the maximum amplitude of the input signal A. Provision is made such that the quantizer 30 supplies, as an output, 1 when the amplitude of the input signal A entered into the quantizer 30 is not less than $\frac{1}{2}$ of the maximum amplitude of the input signal X, $\frac{1}{2}$ for such an amplitude in the range between $\frac{1}{4}$ and $\frac{1}{2}$, $\frac{1}{4}$ for such an amplitude in the range between $\frac{5}{32}$ and $\frac{1}{4}$, $\frac{1}{8}$ for such an amplitude in the range between $\frac{1}{8}$ and $\frac{5}{32}$, for such an amplitude in the range between $-\frac{1}{8}$ and $\frac{1}{8}$, $-\frac{1}{8}$ for such an amplitude in the range between $-\frac{5}{32}$ and $-\frac{1}{8}$, $-\frac{1}{4}$ for such an amplitude in the range between $-\frac{1}{4}$ and $-\frac{5}{32}$, $-\frac{1}{2}$ for such an amplitude in the range between $-\frac{1}{2}$ and $-\frac{1}{4}$, and $-1$ when such an amplitude is not greater than $-\frac{1}{2}$.

Figure 8:
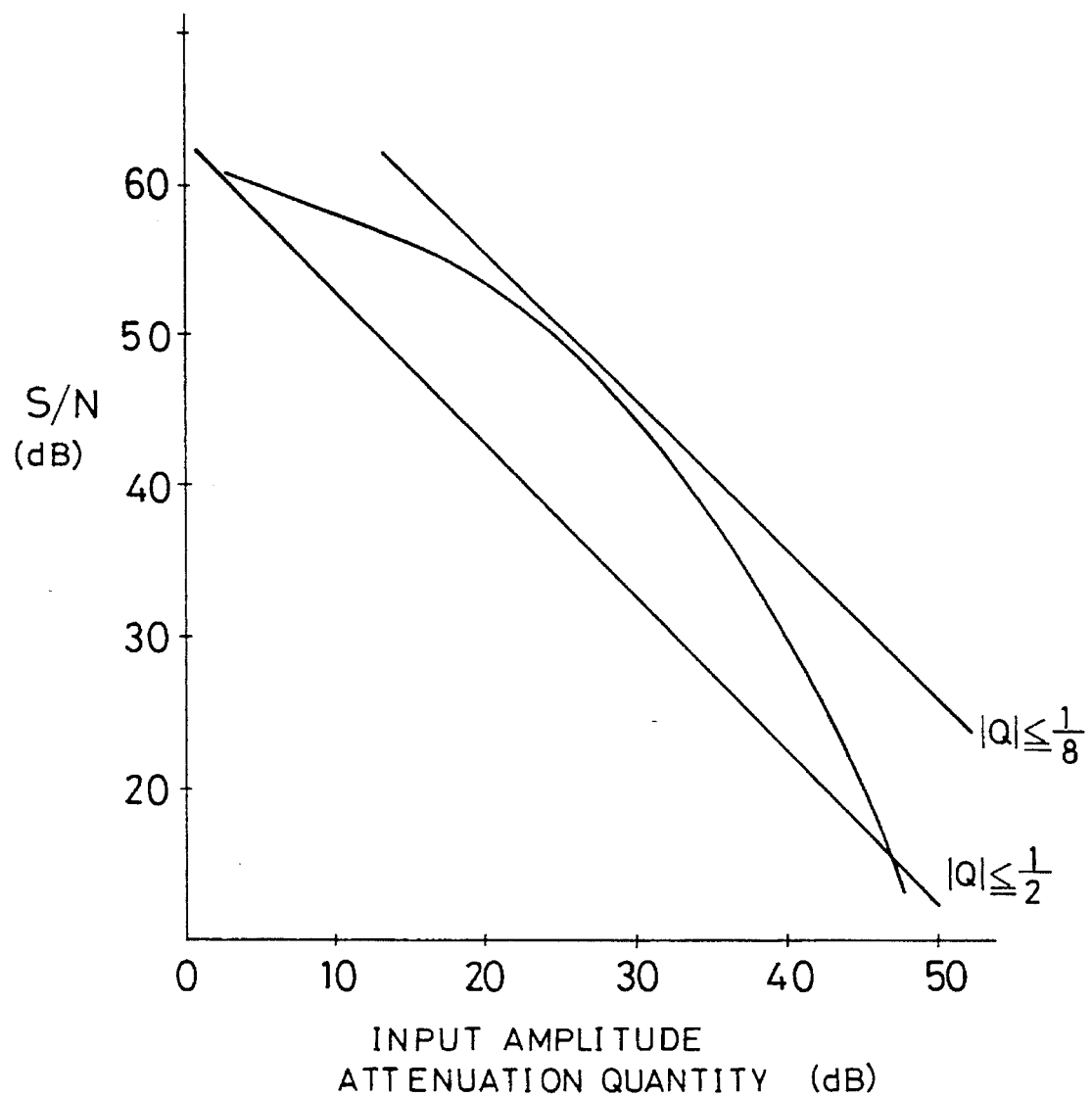
FIG. 8 is a view illustrating the signal/total noise ratio characteristics dependent on the input amplitude in the noise shaper in FIG. 7 (a)

FIG. 8 shows the S/N ratio characteristics of the noise shaper shown in FIG. 7 (a). As apparent from FIG. 8, as the input amplitude attenuation quantity is increased from about 25 dB, i.e., as the amplitude of the input signal A is decreased, the quantization noise Q is increased, thus lowering the S/N ratio characteristics. As a result, when a telephonic communication is made with a portable telephone set or the like, an unnecessary signal such as a voice talking signal therearound disappears or is converted into a meaningless signal such as natural noise. This improves the telephonic communication in articulation. The S/N ratio characteristics above-mentioned can be obtained only by the fact that the reference levels in the quantizer 30 are set such that there are present a plurality of average amplitudes for the quantization noise Q, This marks the advantage of the present invention.

An AD converter and a DA converter each using the noise shaper shown in FIG. 7 (a), respectively have the same arrangements as those shown in FIGS. 3 and 4. Therefore, the description thereof is here omitted.

Figure 9:
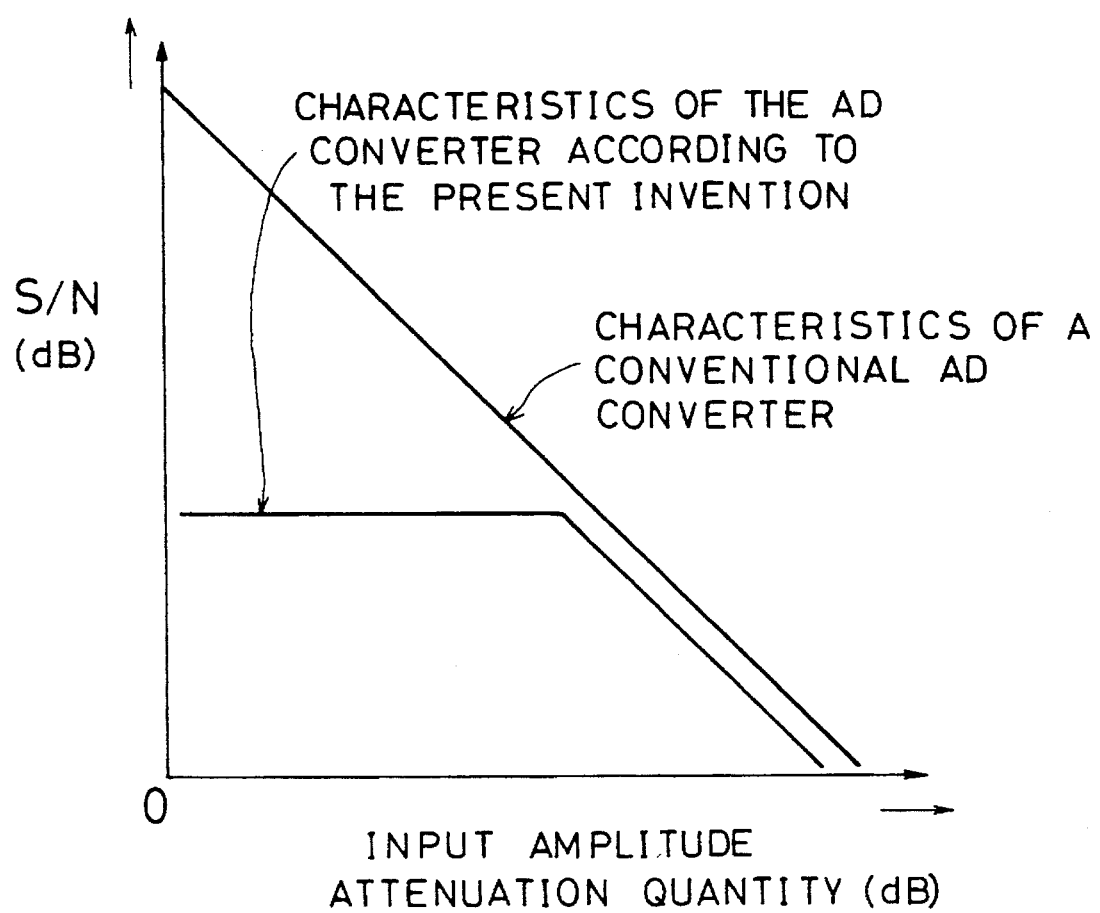
FIG. 9 is a view illustrating the signal/total noise ratio characteristics dependent on the input amplitude in another noise shaper.

In the present invention, the reference levels in the quantizer are set such that there are present, according to the amplitude of an input signal, a plurality of average amplitudes for the quantization noise Q. Accordingly, as shown in FIG. 9, it is possible to achieve the characteristics that the S/N ratio is substantially constant up to a certain input amplitude attenuation quantity. When an AD converter in a digital instrument is provided with such S/N ratio characteristics, there can be obtained a very useful digital instrument. More specifically, since the S/N ratio is substantially constant regardless of the size of the amplitude of an input signal, the number of effective digits of an obtained AD conversion level is substantially constant regardless of the amplitude of the input signal. For example, in an instrument for measuring 0 V to 10 V in seeps of 1 μV, a 7-digit display is made for both measurements of voltages on the order of several V and on the order of several μV when the instrument uses a conventional AD converter, as shown in FIG. 10. However, there are many instances where a numerical value on the order of μV is substantially meaningless when measuring a voltage on the order of several V. Generally, it is enough that measurement is made up to the order of at most several mV for measurement of several V, and it is also enough that measurement is made up to the order of 1μV for measurement of 1 mV. In this point of view, an AD converter using the noise shaper of the present invention produces an excellent effect which conforms with the situation of actual usage. In the case above-mentioned, a measured voltage is displayed, for example, in the form of 4-digit mantissa and 1-digit exponent as shown in FIG. 10. Further, when forming an instrument for measuring 0 V to 10 V in steps of 1 μV with the use of a conventional 1-bit quantizer, there can be selected any of arrangements in which the oversampling magnification is increased, a linear multiple-level quantizer is used and a high-order noise shaper is used. However, the arrangements above-mentioned present the problems of an increase in power consumption, an increase in hardware size and the like. According to the present invention, however, the reference levels in the quantizer are set such that there are present, according to the amplitude of an input signal, a plurality of average amplitudes of quantization noise. Accordingly, the instrument above-mentioned can be readily achieved without causing the problems above-mentioned, and is therefore high in industrial applicability.

The output levels and reference levels of a quantizer in the present invention are not limited to those specifically set forth in each of the embodiments above-mentioned. Included in the present invention are all arrangements in each of which the level of quantization noise supplied from a quantizer is not constant, but there are a plurality of quantization noise levels according to the amplitude of an input signal.

We claim:

1. A signal converter comprising a quantizer in which an input signal is compared with each of preset (n–1) reference levels and quantized into one of n-digital output signals, said (n–1) reference levels in said quantizer being set such that there are present, according to the amplitude of said input signal, a plurality of average amplitudes for a difference signal representing a difference between said input signal and an output signal of said quantizer.

2. In an oversampling noise shaper comprising:

a quantizer in which an input signal is compared with each of preset (n–1) reference levels and quantized into one of n-digital output signals;

a delay device for delaying a digital output signal of said quantizer by a preset period of time; and signal accumulating means for accumulating each difference signal between each external input signal and each output signal of said delay device, an output signal of said signal accumulating means being entered into said quantizer;

said oversampling noise shaper characterized in that said (n–1) reference levels in said quantizer are set such that there are present, according to the amplitude of said input signal, a plurality of average amplitudes for a difference signal representing a difference between said input signal and said output signal of said quantizer.

3. In a noise shaping AD converter comprising:

a quantizer in which an input signal is compared with each of preset (n–1) reference levels and quantized into one of n-digital output signals;

a delay device for delaying a digital output signal of said quantizer by a preset period of time;

a DA converting circuit for converting an n-level digital output signal of said delay device into an n-level analog signal; and signal accumulating means for accumulating each difference signal between each external analog input signal and each analog signal supplied from said DA converting circuit, an output signal of said signal accumulating means being entered into said quantizer;

said noise shaping AD converter characterized in that said (n–1) reference levels in said quantizer are set such that there are present, according to the amplitude of said input signal, a plurality of average amplitudes for a difference signal representing a difference between said input signal and said output signal of said quantizer.

4. In a noise shaping DA converter comprising:

a quantizer in which an input signal is compared with each of preset (n–1) reference levels and quantized into one of n-digital output signals;

a delay device for delaying an n-level digital output signal of said quantizer by a preset period of time;

signal accumulating means for accumulating each difference signal between each external digital input signal and each digital signal supplied from said delay device, an output signal of said signal accumulating means being entered into said quantizer; and a DA converting circuit for converting said n-level digital output signal of said quantizer into an n-level analog signal;

said noise shaping DA converter characterized in that said (n–1) reference levels in said quantizer are set such that there are present, according to the amplitude of said input signal, a plurality of average amplitude levels for a difference signal representing a difference between said input signal and said output signal of said quantizer.

5. A signal converter, a noise shaper, a noise shaping AD converter or a noise shaping DA converter according to any of claims 1 to 4, wherein the (n–1) reference levels in the quantizer are set such that the average amplitude of a difference signal representing a difference between the input signal and the output signal of said quantizer is small when the amplitude of said input signal is small.

6. A signal converter, a noise shaper, a noise shaping AD converter or a noise shaping DA converter according to any of claims 1 to 4, wherein the (n–1) reference levels in the quantizer are set such that the interval between adjacent reference levels is narrower as the amplitude of the input signal is closer to zero, and the interval between adjacent reference levels is broader as the absolute value of said amplitude of said input signal is greater.

7. A signal converter, a noise shaper, a noise shaping AD converter or a noise shaping DA converter according to any of claims 1 to 4, wherein the (n–1) reference levels in the quantizer are 4-level values of $-\frac{1}{4}$, $-\frac{1}{32}$, $+\frac{1}{32}$ and $+\frac{1}{4}$ with respect to the maximum amplitude of the input signal.

8. A signal converter, a noise shaper, a noise shaping AD converter or a noise shaping DA converter according to any of claims 1 to 4, wherein the (n–1) reference levels in the quantizer are set such that the average amplitude of a difference signal representing a difference between the input signal and the output signal of said quantizer, is great when the amplitude of said input signal is small.

9. A converter, a noise shaper, a noise shaping AD converter or a noise shaping DA converter according to any of claims 2 to 4, wherein the number of the signal accumulating means is one and said noise shaper, said noise shaping AD converter or said noise shaping DA converter is of the delta-sigma type.

10. A signal converter, a noise shaper, a shaping AD converter or a noise shaping DA converter according to any of claims 2 to 4, wherein a plurality of signal accumulating means are disposed and connected in series to one another and said noise shaper, said noise shaping AD converter or said noise shaping DA converter is of the delta-sigma type.

11. A noise shaper, a noise shaping AD converter or a noise shaping DA converter according to any of claims 2 to 4, wherein said noise shaper, said noise shaping AD converter or said noise shaping DA converter is of the delta-sigma type.

12. A signal converter, a noise shaper noise shaping AD converter or a noise shaping DA converter according to claim 5, wherein the (n−1) reference levels in the quantizer are 4-level values of −¼, −1/32, +1/32 and +¼ with respect to the maximum amplitude of the input signal.

13. A signal converter, a noise shaper, a noise shaping AD converter or a noise shaping DA converter according to claim 6, wherein the (n−1) reference levels in the quantizer are 4-level values of −¼, −1/32, +1/32 and +¼ with respect to the maximum amplitude of the input signal.

* * * * *

(12) REEXAMINATION CERTIFICATE (4530th)
United States Patent
Sakiyama et al.

(10) Number: US 5,550,544 C1
(45) Certificate Issued: Feb. 12, 2002

(54) SIGNAL CONVERTER NOISE SHAPER, AD CONVERTER AND DA CONVERTER

(75) Inventors: Shiro Sakiyama; Shiro Dosho; Masakatsu Maruyama; Hiroyuki Nakahira, all of Osaka; Toshiyuki Shono; Akira Matsuzawa, both of Kyoto, all of (JP)

(73) Assignee: Matsushita Electric Industrial Co., Ltd., Kadoma (JP)

Reexamination Request:
No. 90/005,100, Sep. 10, 1998

Reexamination Certificate for:
Patent No.: 5,550,544
Issued: Aug. 27, 1996
Appl. No.: 08/200,493
Filed: Feb. 23, 1994

(51) Int. Cl.[7] ............................................. H03M 1/00
(52) U.S. Cl. ........................................ 341/155; 341/144
(58) Field of Search ................................. 341/143, 145, 341/155, 200

(56) References Cited
PUBLICATIONS

Jayant, J.S., and Peter Noll, "4.5 Logarithmic Quantization," *Digital Coding of Waveforms: Principles and Applications to Speech and Video*, Englewood Cliffs: Prentice–Hall, Inc., 1984, 141–146.

Zhang, Z., and G.C. Temes, "Multibit Oversampled Σ—Δ A/D Converter with Nonuniform Quantization," Electronics Letters, vol. 27, No. 6, Mar. 14, 1991, 528–530.

*Primary Examiner*—Brian Young

(57) ABSTRACT

The present invention provides a first-order delta-sigma AD converter adapted to conduct noise shaping and having a quantizer arranged such that, when the amplitude of an input signal entered into the quantizer is small, the amplitude of a difference signal between the input signal entered into the quantizer and an output signal therefrom, is small. It is therefore possible to achieve an efficient AD- or DA-converter reduced in power consumption, which satisfies the transmission characteristics of the specifications of CCITT G.714 based on a method of PCM-encoding an audio frequency band signal stipulated in the specifications of CCITT G.711.

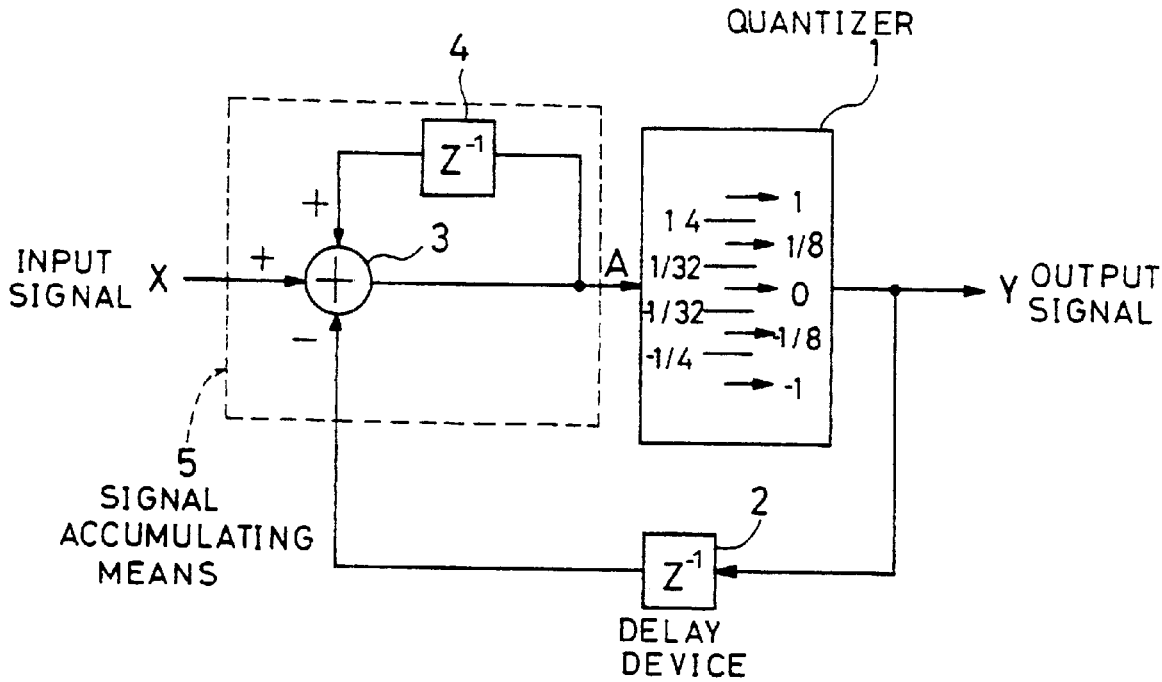

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 4, 5, 6, 7, 8, 9, 10, 11, 12 and 13 is confirmed.

Claims 1–3 are cancelled.

* * * * *